(12) United States Patent
Atkinson

(10) Patent No.: US 10,663,496 B2
(45) Date of Patent: May 26, 2020

(54) CABLE ERROR SIGNAL

(71) Applicant: HEWLETT-PACKARD DEVELOPMENT COMPANY, L.P., Houston, TX (US)

(72) Inventor: Lee Atkinson, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 313 days.

(21) Appl. No.: 15/111,536

(22) PCT Filed: Feb. 18, 2014

(86) PCT No.: PCT/US2014/016813
§ 371 (c)(1),
(2) Date: Jul. 14, 2016

(87) PCT Pub. No.: WO2015/126356
PCT Pub. Date: Aug. 27, 2015

(65) Prior Publication Data
US 2016/0349292 A1 Dec. 1, 2016

(51) Int. Cl.
*G01R 19/165* (2006.01)
*G06F 1/28* (2006.01)
*G01R 31/58* (2020.01)
*G06F 13/40* (2006.01)

(52) U.S. Cl.
CPC .......... *G01R 19/165* (2013.01); *G01R 31/58* (2020.01); *G06F 1/28* (2013.01); *G06F 13/4068* (2013.01)

(58) Field of Classification Search
CPC ....... G01R 19/165; G01R 31/021; G06F 1/28; G06F 13/4068

USPC .......................................................... 324/539
See application file for complete search history.

(56) References Cited

U.S. PATENT DOCUMENTS

| | | | |
|---|---|---|---|
| 7,941,677 B2 | 5/2011 | Penning | |
| 2007/0024239 A1 | 2/2007 | Park | |
| 2007/0167069 A1 | 7/2007 | Murakami | |
| 2012/0003863 A1 | 1/2012 | Sung et al. | |
| 2012/0016618 A1* | 1/2012 | Astigarraga | G01R 31/021 702/109 |

(Continued)

FOREIGN PATENT DOCUMENTS

| | | |
|---|---|---|
| CN | 101627348 | 1/2010 |
| CN | 103078359 A | 5/2013 |

(Continued)

OTHER PUBLICATIONS

Lynn et al.; "Universal Serial Bus (USB) Power Management", < http://ieeexplore.ieee.org/xpl/login.jsp?tp=&arnumber=632372&url= http%3A%2F%2Fieeex > On pp. 434-441, Nov. 1997.

(Continued)

*Primary Examiner* — Melissa J Koval
*Assistant Examiner* — Courtney G McDonnough
(74) *Attorney, Agent, or Firm* — HP Inc. Patent Department

(57) ABSTRACT

A computing device in tiding a data port for receiving power. A detector can determine if a cable attached to the data port is capable of providing power greater than a threshold level to the computing device. A controller can generate an error signal to alert a user that the cable does not provide power over the threshold level to the computing device.

16 Claims, 4 Drawing Sheets

(56) References Cited

U.S. PATENT DOCUMENTS

| | | |
|---|---|---|
| 2012/0185616 A1* | 7/2012 | Ho .................. G06F 9/4411 |
| | | 710/11 |
| 2012/0297207 A1* | 11/2012 | Carlsen ............... G06F 13/4081 |
| | | 713/300 |
| 2012/0306455 A1 | 12/2012 | Fischbach et al. |
| 2013/0099758 A1 | 4/2013 | Kim |
| 2013/0200841 A1 | 8/2013 | Farkas et al. |
| 2013/0268414 A1* | 10/2013 | Lehtiniemi ............ G06Q 30/06 |
| | | 705/27.2 |
| 2013/0339769 A1 | 12/2013 | Waters |
| 2014/0173141 A1* | 6/2014 | Waters .................... G06F 1/22 |
| | | 710/16 |
| 2015/0137789 A1* | 5/2015 | Furtner .................... G05F 5/00 |
| | | 323/318 |
| 2015/0142993 A1* | 5/2015 | Blanc .................. G06F 13/387 |
| | | 710/16 |

FOREIGN PATENT DOCUMENTS

| | | |
|---|---|---|
| EP | 2520937 A2 | 11/2012 |
| KR | 10-2006-0100054 | 9/2006 |
| TW | 535171 | 6/2003 |
| WO | WO-2013-006543 | 1/2013 |

OTHER PUBLICATIONS

"USB Power Delivery—1.0 Intruction USB-IF Copyright 2012", Jul. 16, 2012 (Jul. 16, 2012), XP055191145.
"USB Power Delivery Specification Revision 1.0", Jun. 26, 2013 (Jun. 26, 2013), XP055244031.
Universal Serial Bus Power Delivery Specification.

* cited by examiner

CABLE ERROR SIGNAL

BACKGROUND

Universal serial bus (USB) was designed to connect computer pen peripherals (including keyboards, pointing devices, digital cameras, printers, portable media players, disk drives, network adapters and other peripherals) to computing devices, both to communicate and to supply electric power. Computing devices can be for example notebooks, desktops, smartphones, PDAs and video game consoles.

BRIEF DESCRIPTION OF THE DRAWINGS

Some examples of the invention are described with respect to the following figures.

DETAILED DESCRIPTION

Figure 1:
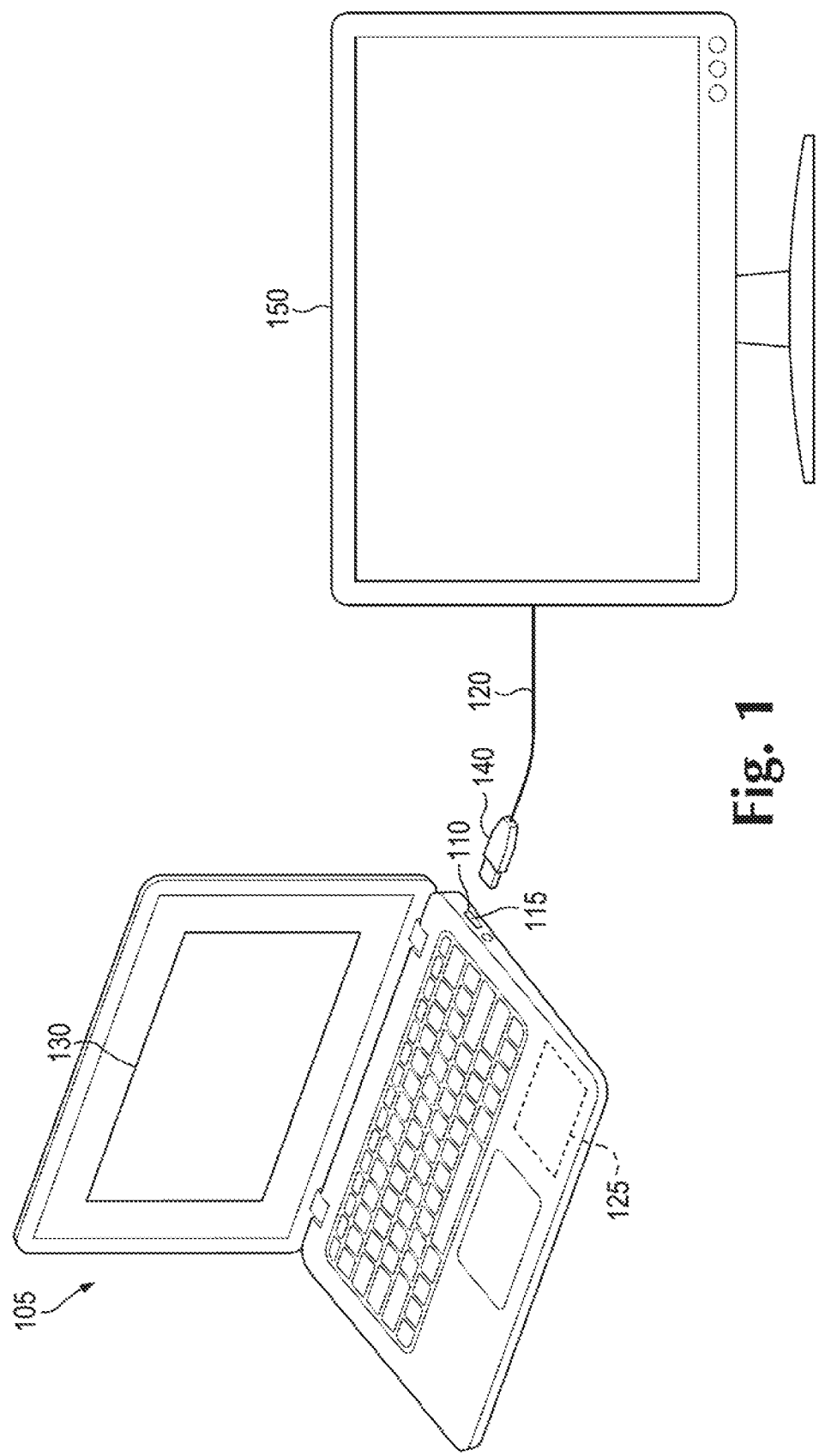
FIG. 1 is a diagram of a device according to are example implementation.

Many computing devices use more power to operate than can be provided by Universal Serial Bus (USB) standards such as 2.0 or 3.0. For example many notebooks operate on 45 to 90 watt power supplies. The power supplies for notebooks computers use an electrical connector that is separate from the USB port on the notebook. Universal Serial Bus Power delivery (USB-PD) was introduced so that a notebook could receive the power levels it uses while also sending and receiving data using one cable and one USB-PD port on the computing device. This allows a portable computing device to connect to an external source such as a docking station for example through a single cable and still receive power from the docking station.

In USB Power Delivery, pairs of directly attached ports negotiate voltage, current and/or direction of power flow over the power conductor (VBUS). The negotiations are done by sending and receiving signals on the power conductor (VBUS) rather than the data conductors of the USB connection. The USB Power Delivery system has a communications stack that includes a device policy manager, policy engine, protocol, and a physical layer. The Protocol Layer forms the messages used to communicate information between a pair of ports. It receives inputs from the Policy Engine indicating which messages to send and indicates the responses back to the Policy Engine. The Physical Layer is responsible for sending and receiving messages across VBUS and includes a transceiver that superimposes a signal on the VBUS wire.

USB power delivery ports are backwards compatible with USB 1.0-3.0 cables however USB was limited to 5 volts and 1.5 amps therefore the cables for USB 1.0-3.0 for example do not have to be of a capacity to handle the increased power of USB power delivery that could reach 100 watts, if a cable is plugged into a system the voltage, current and direction will be negotiated based on among other things the type of cable detected. The plug on the cable is identified by the USB port and from there the cable is detected. The user is not notified of the result of the negotiation. The result of the negotiation could generate an error message if the cable detection results in the default profile of 10 W rather than one of the higher power USB power delivery profiles of 18 W, 36 W, 60 W, or 100 W.

In one implementation, a computing device can include a data port for receiving power. A detector can determine if a cable attached to the data port is capable of providing power greater than a threshold level to the computing device. A controller can generate an error signal to alert a user that the cable does not provide power over the threshold level to the computing device.

In another implementation, a method of providing power supply feedback can include detecting the time of cable connected to a serial data port of a computing device. It can be determined if the type of cable connected is capable of supplying power above a threshold amount. An error indication can be generated if the cable does not supply power above the threshold amount.

In another implementation, a computer readable medium can include code that if executed by a controller in a computing device causes the controller to receive a cable type indicator of a cable connected to a data port. The code can also cause the controller to generate an error indication if the cable does not supply power above a threshold amount.

With reference to the figures, FIG. 1 is a diagram of a device according to an example implementation. A computing device 105 can include a data port 110 for receiving power. The data port 110 can include power terminals and data terminals. The data port 110 may be for example a USB power delivery port. A USB power deliver port has signals that are embedded by a controller 125 on the voltage bus (VBUS) that is connected to the power terminals. The signals on the VBUS are used to by a controller 125 on the computing device 105 and a controller on the power source 150 to negotiate the highest power that can be provided by the data port and the direction of the power supplied.

The data port 110 can include a detector 115 to determine if a cable attached to the data port is capable of providing power greater than a threshold level to the computing device. The detector 115 may be for example a Plug identification device to detect a signal from a plug 140 on the end of a USB cable 120. The plug 140 may include information about the maximum power that can be corned by the cable overloading the rating on the cable. For example the plug 140 may identify the cable as a 60 watt cable and the controller 125 can negotiate with the controller on the power source 150 to provide no more than 60 watts on the cable 120. The plug 140 for cables with different power ratings may all be able to connect to the data port 110 and the identification of the plug and therefore the cable may not be based on the physical dimensions for example, the information may be by detecting the state of a pin in the plug or another form of detection. For example in a plug that is not capable of over 10 watts the identification pin (ID pin) may be grounded. In another example a low power cable may have an ID pin connected to ground through a resistor and to the VBUS through a capacitor. USB for example includes many types of plugs including A, B, micro, mini and others. In another example a power cable may have the ID pin connected to ground through a resistor for one type of data port plug. In still other examples, the ID pin may be connected to ground through a capacitor for a 3 A cable, the ID pin can be connected to the VBUS through a capacitor for a 5 A cable.

A controller 125 can determine the type of cable from the ID pin in ire the plug. The type of cable can include the maximum power rating of the plug. The controller 125 can negotiate with controller on the other power source 150 to determine the maximum power that can be supplied over the cable 120. In one implementation if the ID pin does not identify the cable as having a maximum power rating above a threshold level the controller may not attempt to negotiate power over the VBUS and the system may supply power at a default level. If the negotiated power would be higher but for the type of cable the controller 125 can generate an error signal to alert a user that the cable 120 does not provide rated power over the threshold level to the computing device 105 from the power source 150.

Figure 2:
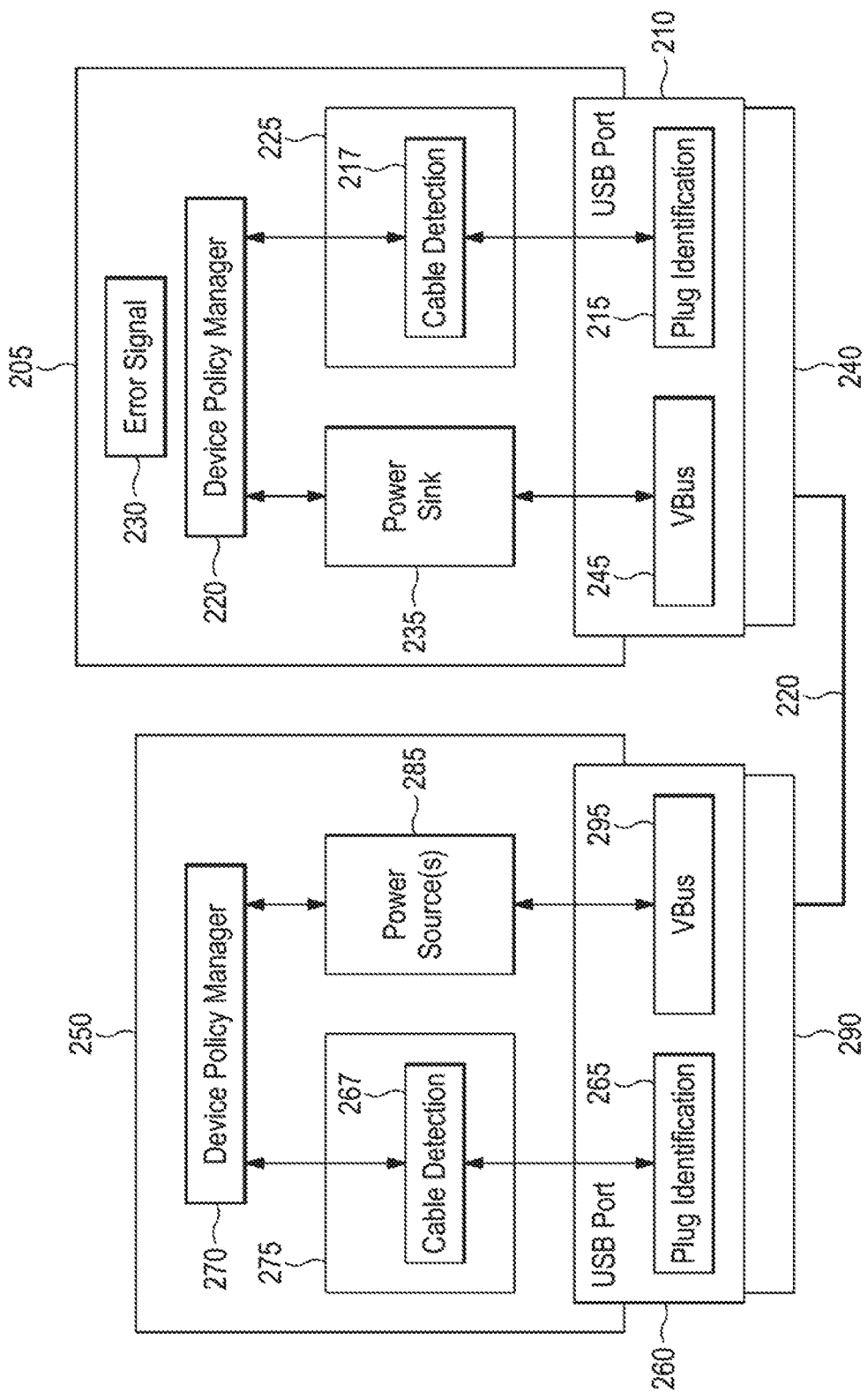
FIG. 2 is a block diagram of a device according to an example implementation.

FIG. 2 is a block diagram of a device according to an example implementation. The computing device may be 205, can include a USB port 210. The USB port 210 can include a Plug Identification Module 215. The Plug identification module can determine the type of plug 240 connected to the USB port 210.

The plug 240 can be connected to a cable 220. The cable can also have second plug 290. The second plug 290 can be connected to another device such as power source 250. The power source 250 may be for example an AC/DC power adapter and may be included in a docking station, display device, standalone power adapter or another device. The power source 250 may include a USB port 260 with a plug identification module 265. The USB port 260 can connect the power terminals such as the VBUS terminals 295 to the power terminals of the plug 290 and the USB port 210 can connect the power terminals such as the VBUS terminals 245 to the power terminals of the plug 240.

The VBUS terminals 295 can be connected to the controller 275 and the power source 285. The controller 275 determines using the cable detection module 267 the type of plug 290 from the plug identification module 265 in the USB port 260.

The VBUS terminals 245 can be connected to the controller 225 and the power sink 235. The controller 225 determines using the cable detection module 217 the type of plug 240 from the plug identification module 215 in the USB port 210. The controller 225 negotiates with the controller 275 to determine the maximum power that can be provided by the cable 220. Once the maximum power is negotiated the power source 285 can provide power that is used by the power sink 235. The controller 275 can communicate to the device policy manager 270 that instructs the power source 285 on the power level to supply. The controller 225 can communicate to the device policy manager 220 how much power the power sink 235 can draw from the power source 250. The controller 225 can cause the computing device to only draw power below the threshold level, for example the threshold could be power, voltage or current such as 10 watts, 5 volts or 1.5 amps.

If the controller 225 determines that the power provider 250 can provide more power than the negotiated power and the computing device 205 can receive more power than the negotiated amount the controller can generate an error signal 230, in one implementation, if a USB 2.0 cable is attached to the USB port 210 the error message is generated and if the cable is a USB-Power delivery (USD-PD) cable the error message is not generated. The error signal 230 can indicate that the cable is not capable of carrying the power that can be provided by the power source 250 and received by the computing device 205.

Figure 3:
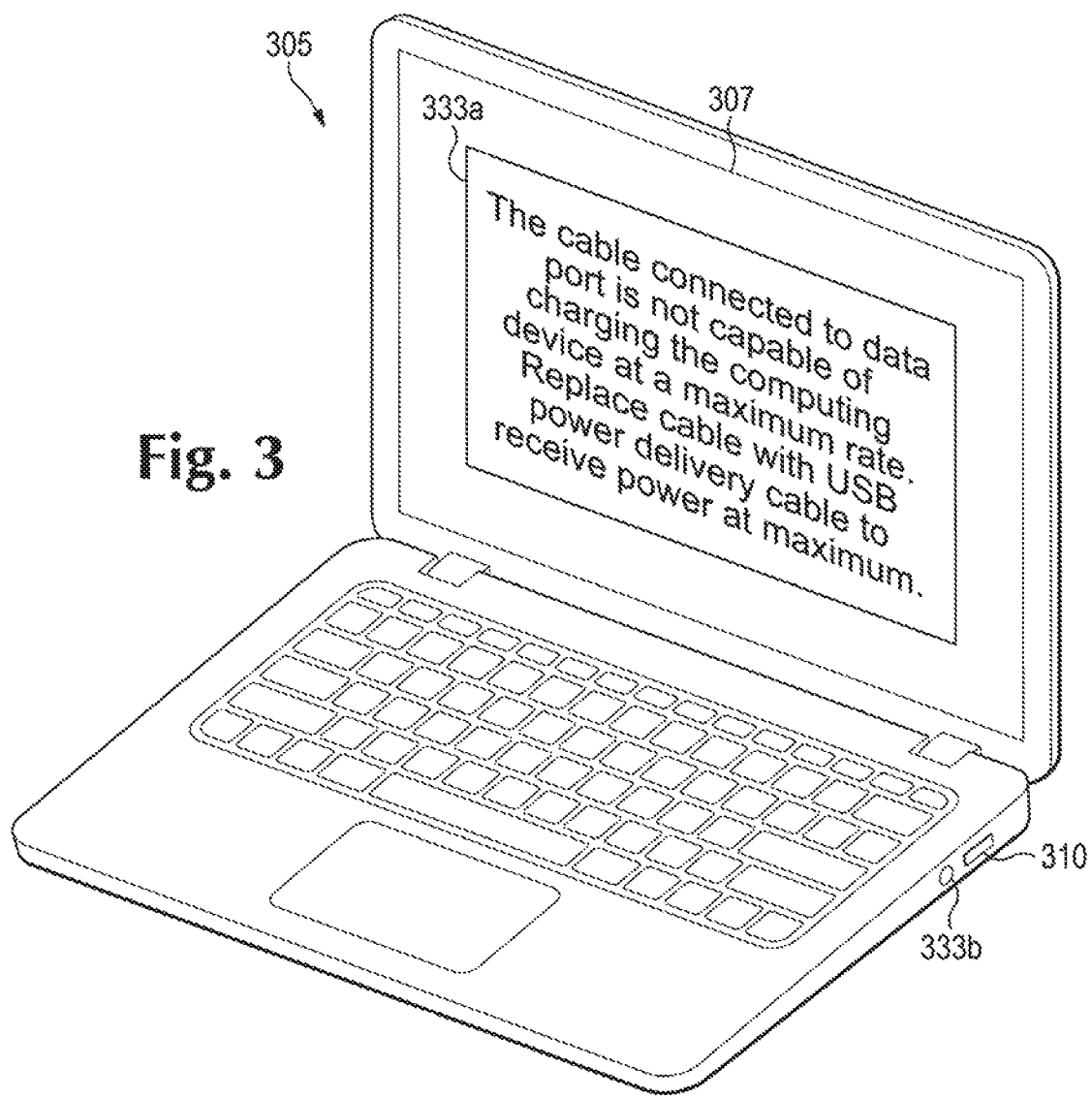
FIG. 3 is an error message of a device according to an example implementation.

FIG. 3 is an error message of a device according to an example implementation. The computing device 305 may be a notebook computer, desktop computer, tablet computer, smart phone, or another computing device. The computing device may include a display that can display an error signal 333a or 333b. In the implementation, the error signal 333a is a message on the display 307. The message may be for example, "The cable connected to data port is not capable of charging the computing device at the maximum rate. Replace cable with USB power delivery cable to receive power at maximum rate." The error signal 333b could also be an illuminated indicator such as a light emitting diode (LED). The LED may be adjacent the data port such as a USB port 310. For example the LED may light continuously when a USB power deliver cable is attached and flashes when a non-USB power delivery cable is attached to the USB port 310 although the LED may illuminated in other patterns to indicate the type of cable. The error signal may also be audible for example.

The message may include a system characteristic of the computing device based on the cable. For example, the computing device may determine to use an integrated graphics module that draws less power than a discrete graphics module if the cable can carry no more than 10 watts or a discrete graphics module if the cable can carry up to 60 watts or in another example the computing device may not charge a battery on 10 watts but would charge the battery on 60 watts. The error signal may include information comparing the system operation of the computing device on 10 watts with the system operation of the computing device on 60 watts.

An error message may also include a link to purchase a cable to provide power above a threshold. The link may be a hyperlink that accesses a web store through a web browser. The link may be for purchasing a USB power deliver cable.

Figure 4:
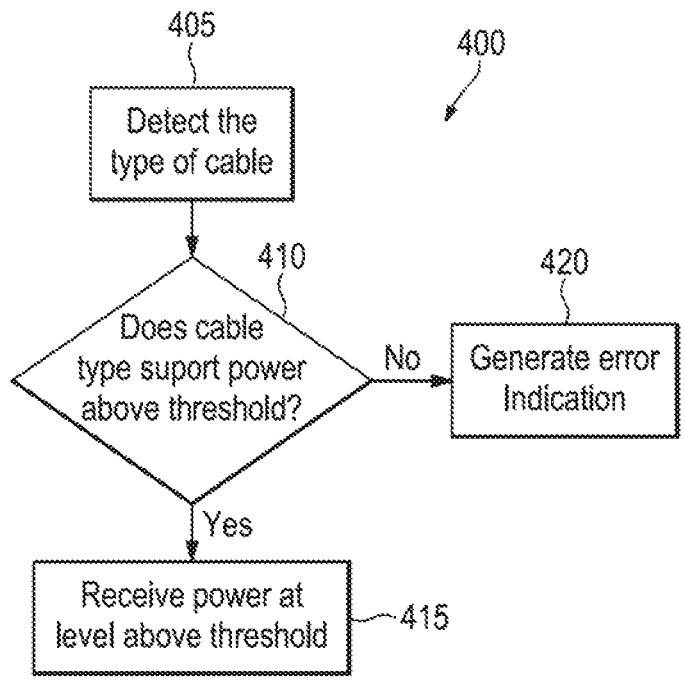
FIG. 4 is a flow diagram of a method of generating error indication according to an example implementation.

FIG. 4 is a flow diagram of a method of generating an error indication according to an example implementation. A method 400 of providing power supply feedback can include detecting the type of cable connected to a serial data port of a computing device at 405. In one implementation, the serial data port is a universal serial bus power delivery port (USB-PD).

The type of cable determination may be a non-USB power delivery cable or a USB power delivery cable. The detection may be by a USB port such as USB port 210 or a controller such as controller 225. The controller such as controller 225 can determine if the type of cable connected is capable of supplying power above a threshold at 410. The threshold may be power, voltage or current such as 10 watts, 5 volts or 1.5 amps. If the cable does not supply power above a threshold amount an error indication can be generated at 420. Even if an error message is generated power may still be transferred but at a level at or below the threshold amount, such as at least one of a lower voltage and a lower current. The computing device may limit the power consumption to conform to the capability of the power source and cable by for example decreasing processor performance or limiting battery charge current. If the cable can support power above the threshold then the power is received at a level above the threshold at 415.

The method may include generating a comparison ref a USB power delivery compliant cable and a non-compliant cable. The comparison may include the difference in system performance when a USB power delivery is used rather than a non-USB power delivery cable such as faster battery charging or faster graphics processing. The comparison can then be part of the error indication.

Figure 5:
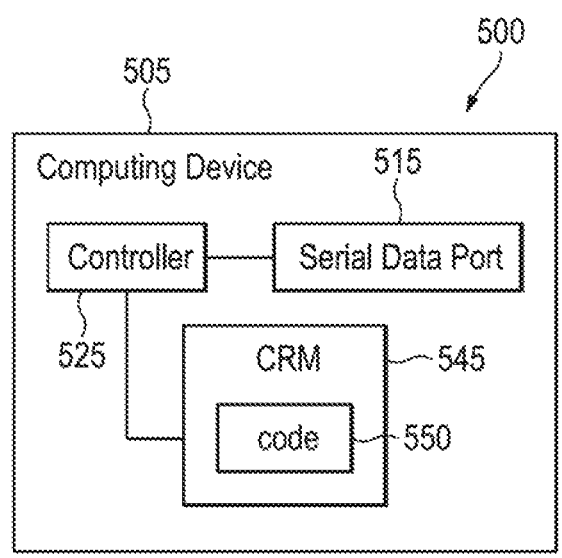
FIG. 5 is a computing system including a computer readable medium according to an example implementation.

FIG. 5 is a computing system including a computer readable medium according to an example implementation.

A system 500 can include a computing device 606 with a computing readable medium 545. The computer readable medium 545 can include code 550 that if executed by a controller 525 in a computing device causes the controller to receive a cable type indicator. The cable type indicator can indicate the type of cable connected to a data port 515. The controller can generate an error indication if the cable does not supply power above a threshold amount. The controller 525 may generate the error indication if the cable dues not supply power above a threshold amount of 5 volts or 1.5 amps.

The techniques described above may be embodied in a computer-readable medium for configuring a computing system. The computer readable media may include, for example and without limitation, any number of the following non-transitive mediums: magnetic storage media including disk and tape storage media; optical storage media such as compact disk media (e.g., CD-ROM, CD-R, etc.) and digital video disk storage media; holographic memory; nonvolatile memory storage media including semiconductor-based memory units such as FLASH memory. EEPROM, EPROM, ROM; ferromagnetic digital memories; volatile storage media including registers, buffers or caches, main memory, RAM, etc.; and the Internet, just to name a few. Other new and various types of computer-readable media may be used to store the software modules discussed herein. Computing systems may be found in many forms including but not limited to mainframes, minicomputers, servers, workstations, personal computers, notepads, personal digital assistants, various wireless devices and embedded systems, just to name a few.

It is to be understood that the phraseology and terminology used herein is for the purpose of description and should not be regarded as limiting. The use of "comprising", "including" or "having" are synonymous and variations thereof herein are meant to be inclusive or open-ended and do not exclude additional unrecited elements or method steps. It should also be noted that a plurality of hardware and software based devices, as we as a plurality of different structural components may be used to implement the disclosed methods and systems.

In the foregoing description, numerous details are set forth to provide understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A computing device comprising:
    a data port to receive power, wherein the data port comprises a universal serial bus power delivery port (USB-PD);
    a detector to identify a plug on an end of a cable when the cable is attached to the data port;
    a first controller to determine a type of the cable based on identification of the plug, wherein the first controller is to determine if a cable when attached to the data port is capable of providing power greater than a threshold level to the computing device based upon a combination of the type of the cable and negotiation by the first controller with a second controller to determine maximum power capable of being supplied over the cable,
    wherein the first controller is to generate an error signal to alert a user when the cable does not provide rated power over the threshold level to the computing device, and
    wherein the first controller is to generate a comparison of the computing device performance when the cable is a USB-PD compliant cable with the computing device performance when the cable is a non-compliant cable;
    a display device to display a message containing the error signal; and
    a link in the error signal to provide an ability to purchase a cable to provide power above a threshold.

2. The device of claim 1, wherein the first controller is to cause the computing device to draw power at or below the threshold level when the cable does not provide rated power over the threshold level.

3. The device of claim 1, wherein the error signal is transmitted through an LED adjacent the data port.

4. The device of claim 3, wherein the message further comprises a comparison of a system characteristic of the computing device on power drawn by the cable and the system characteristic of the computing device on the rated power over the threshold level.

5. The device of claim 3, wherein the first controller is to negotiate with the second controller in the power source over a voltage bus of the data port to determine if the rated power of the cable is over the threshold level.

6. The device of claim 1, wherein the threshold level is 5 volts or 1.5 amps.

7. The device of claim 1, wherein the cable type is determined from an ID pin in a plug connected to the cable.

8. A method of providing power supply feedback comprising:
    determining a type of cable connected to a serial data port of a computing device by a plug, wherein the serial data port is a universal serial bus power delivery port (USB-PD), wherein the computing device includes a first controller, and wherein the determining of the type of cable is carried out by the first controller determining the type of cable from the plug;
    the first controller determining if the type of cable connected is capable of supplying power above a threshold amount based on negotiation by the first controller with a second controller to determine maximum power capable of being supplied over the cable;
    generating a comparison of the computing device performance when the cable is a USB-PD compliant cable with the computing device performance when the cable is a non-compliant cable;
    the first controller generating an error signal if the cable does not supply power above the threshold amount; and
    displaying a message containing the error signal,
    wherein the error signal comprises a link to provide an ability to purchase a cable to provide power above a threshold.

9. The method of claim 8, further comprising including the comparison in the error signal.

10. The method of claim 8, wherein the threshold amount is 5 volts or 1.5 amps.

11. A non-transitory computer readable storage medium comprising code executable by a first controller in a computing device having a serial data port with a cable connected to the serial data port by a plug, wherein the serial data port is a universal serial bus power delivery port (USB-PD), such that when the code is executed by the first controller in the computing device, the code causes the first controller to:
- determine a type of the cable connected to the serial data port of the computing device;
- determine if the type of cable connected is capable of supplying power above a threshold amount based on negotiation by the first controller with a second controller to determine maximum power capable of being supplied over the cable;
- generate a comparison of the computing device performance when the cable is a USB-PD compliant cable with the computing device performance when the cable is a non-compliant cable;
- generate an error signal if the cable does not supply power above a threshold amount; and
- display a message containing the error signal,
- wherein the error signal comprises a link to provide an ability to purchase a cable to provide power above a threshold.

12. The non-transitory computer readable storage medium of claim 11, further comprising code that if executed causes a computing device to:
- generate the error indication if the cable does not supply power above a threshold amount of 5 volts or 1.5 amps.

13. The method of claim 8, wherein the cable type is determined from an ID pin in the plug connected to the cable.

14. The method of claim 8, wherein if the cable does not supply power above a threshold amount, power is still transferred to the computing device but at a level at or below the threshold amount.

15. The non-transitory computer readable storage medium of claim 11, wherein the cable type is determined from an ID pin in the plug connected to the cable.

16. The non-transitory computer readable storage medium of claim 11, wherein if the cable does not supply power above a threshold amount, power is still transferred to the computing device but at a level at or below the threshold amount.

* * * * *